(12) United States Patent
Hsu et al.

(10) Patent No.: US 8,269,311 B2
(45) Date of Patent: Sep. 18, 2012

(54) MULTILAYER OXIDE ON NITRIDE ON OXIDE STRUCTURE AND METHOD FOR THE MANUFACTURE OF SEMICONDUCTOR DEVICES

(75) Inventors: Chia-Ming Hsu, Shanghai (CN); Wong Cheng Shih, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 189 days.

(21) Appl. No.: 12/845,651

(22) Filed: Jul. 28, 2010

(65) Prior Publication Data
US 2011/0062551 A1  Mar. 17, 2011

(30) Foreign Application Priority Data
Sep. 15, 2009  (CN) .......................... 2009 1 0195968

(51) Int. Cl.
*H01L 29/00*  (2006.01)

(52) U.S. Cl. .................. 257/534; 257/535; 257/E27.048
(58) Field of Classification Search .................. 257/532, 257/534, 535, E27.048
See application file for complete search history.

(56) References Cited

U.S. PATENT DOCUMENTS
2011/0186920 A1* 8/2011 Lim et al. ...................... 257/316
2012/0132972 A1* 5/2012 Hasunuma .................... 257/296
* cited by examiner

*Primary Examiner* — Ngan Ngo
(74) *Attorney, Agent, or Firm* — Kilpatrick Townsend and Stockton LLP

(57) ABSTRACT

An integrated circuit device having a capacitor structure and methods of manufacture are disclosed. The device has a substrate, e.g., silicon wafer, silicon on insulator, epitaxial wafer. The device has a dielectric layer overlying the substrate and a polysilicon layer overlying the dielectric layer. The device has a tungsten silicide layer overlying the polysilicon layer and a first oxide layer overlying the tungsten silicide layer. A nitride layer overlies the oxide layer. A second oxide layer is overlying the nitride layer to form a sandwiched oxide on nitride on oxide structure to form a capacitor dielectric. The device also has an upper capacitor plate formed overlying the second oxide layer.

10 Claims, 3 Drawing Sheets

MULTILAYER OXIDE ON NITRIDE ON OXIDE STRUCTURE AND METHOD FOR THE MANUFACTURE OF SEMICONDUCTOR DEVICES

This application claims priority to Chinese Patent Application No. 200910195968.3, filed on Sep. 15, 2009, entitled "Method and Structure for High Breakdown Voltage Capacitor for High Voltage Devices," by inventors Chia-Ming Hsu and Wong Cheng Shih, commonly assigned, incorporated by reference herein for all purposes.

BACKGROUND OF THE INVENTION

The present invention is directed to integrated circuits and their processing for the manufacture of semiconductor devices. More particularly, the invention provides a method and resulting structure for manufacturing a capacitor structure for system on chip integrated circuits. Although the invention has been described in terms of a general application, many others (e.g., dynamic random access memory devices, static random access memory devices (SRAM), application specific integrated circuit devices (ASIC), microprocessors and microcontrollers, Flash memory devices) can exist.

Integrated circuits or "ICs" have evolved from a handful of interconnected devices fabricated on a single chip of silicon to millions of devices. Conventional ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of U.S. dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of a limitation occurs with an integrated capacitor device. Such capacitor device is often necessary for analog features used in a conventional high voltage liquid crystal display, commonly called LCD, controller system on chip products. The capacitor device should withstand high voltages. That is, the breakdown voltage of the capacitor device must often be high. Unfortunately, limitations exist with conventional capacitor devices for integrated applications. High breakdown voltages are often difficult to achieve. These and other limitations have been described throughout the present specification and more particularly below.

From the above, it is seen that an improved technique for processing semiconductor devices is desired.

BRIEF SUMMARY OF THE INVENTION

According to the present invention, techniques for the manufacture of semiconductor devices are provided. More particularly, embodiments of the invention provide a method and resulting structure for manufacturing a capacitor structure for system on chip integrated circuits. Although the invention has been described in terms of a general application, many others (e.g., dynamic random access memory devices, static random access memory devices (SRAM), application specific integrated circuit devices (ASIC), microprocessors and microcontrollers, Flash memory devices) can exist.

A specific embodiment of the invention provides an integrated circuit device having a capacitor structure. The device has a substrate, e.g., silicon wafer, silicon on insulator, epitaxial wafer. The device has a dielectric layer (e.g., silicon dioxide, silicon oxynitride, silicon nitride) overlying the substrate and a polysilicon layer overlying the dielectric layer. The device has a tungsten silicide layer overlying the polysilicon layer and a first oxide layer overlying the tungsten silicide layer. A nitride layer is overlying the first oxide layer. A second oxide layer is overlying the nitride layer to form a sandwiched oxide on nitride on oxide structure for a capacitor dielectric. The device also has an upper capacitor plate formed overlying the second oxide layer.

An alternative specific embodiment of the invention provides a method for processing integrated circuit devices, e.g., high voltage devices, system on a chip, and others. The method includes providing a semiconductor substrate and forming an oxide layer (or other dielectric layer) overlying the substrate. The method also includes forming a polysilicon layer overlying the oxide layer and depositing a tungsten silicide layer overlying the polysilicon layer. The method includes annealing the tungsten silicide layer to cause further crystallization of the tungsten silicide layer and patterning the tungsten silicide layer and the polysilicon layer to define a bottom electrode of a capacitor structure. The method anneals the patterned bottom electrode to further stabilize one or more grains on one or more edges of the patterned tungsten silicide layer and forms a capacitor dielectric overlying the stabilized tungsten silicide layer. The method includes forming a first oxide layer overlying the tungsten silicide layer, forming a nitride layer overlying the oxide layer, and depositing a second oxide layer overlying the nitride layer to form sandwiched oxide on nitride on oxide structures. The second oxide layer is deposited at a temperature ranging from about 600° C. to about 850° C. in a specific embodiment. In a specific embodiment, the oxide on nitride on oxide stack forms a capacitor dielectric. The temperature range maintains the patterned tungsten layer substantially free from oxidation in a specific embodiment. The method then forms an upper capacitor plate overlying the second oxide layer to form the capacitor structure.

Yet another alternative embodiment of the invention provides a method for processing integrated circuit devices. The method includes providing a semiconductor substrate and forming an oxide layer (or other dielectric film) overlying the substrate. The method includes forming a polysilicon layer overlying the oxide layer and depositing a tungsten silicide layer overlying the polysilicon layer. The method anneals the tungsten silicide layer to cause further crystallization of the tungsten silicide layer and patterns the tungsten silicide layer and the polysilicon layer to define a bottom electrode of a capacitor structure. The patterned bottom electrode is annealed to further stabilize one or more grains on at least one or more edges of the patterned tungsten silicide layer. The method then forms a first oxide layer at a thickness ranging from about 5 to 40 nanometers overlying the tungsten silicide layer and forms a nitride layer at a thickness ranging from about 5 to 40 nanometers overlying the oxide layer in a specific embodiment. A second oxide layer is deposited to a thickness ranging from about 5 nanometers to about 40 nanometers at a temperature ranging from about 600° C. to about 850° C. overlying the nitride layer to form a sandwiched oxide on nitride on oxide structure for a capacitor dielectric in a specific embodiment. The temperature range preferably maintains the patterned tungsten silicide layer substantially free from oxidation. An upper capacitor plate is formed overlying the second oxide layer to form the capacitor structure. The capacitor structure is characterized by a breakdown voltage of greater than about 30 volts. In some embodiments, the capacitor structure is provided in a high voltage device, which is capable of a voltage ranging from about 3 volts to greater than about 18 volts.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Preferably, the invention provides a way to manufacture an improved integrated capacitor structure for high voltage applications. Such high voltage applications often require high breakdown voltages such as 30 volts and greater. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for the manufacture of semiconductor devices are provided. More particularly, the invention provides a method and resulting structures for manufacturing a capacitor structure for system on chip integrated circuits.

A method for fabricating a capacitor structure according to an embodiment of the present invention is outlined as follows:

1. Provide a semiconductor substrate, e.g., silicon wafer;
2. Form a dielectric layer (for example, silicon oxide, silicon oxynitride, silicon nitride or high K dielectric material)) overlying the substrate;
3. Form a first polysilicon layer overlying the oxide layer;
4. Deposit a tungsten silicide layer in an initial crystalline state overlying the first polysilicon layer;
5. Anneal the tungsten silicide layer to cause further crystallization of the tungsten silicide layer;
6. Pattern the tungsten silicide layer and the first polysilicon layer to define a bottom electrode of a capacitor structure;
7. Anneal the patterned bottom electrode to further stabilize one or more grains on at least one or more edges of the patterned tungsten silicide layer;
8. Form a first oxide layer at a thickness overlying the tungsten silicide layer at a temperature to maintain the tungsten silicide layer integrity;
9. Form a nitride layer overlying the oxide layer at a temperature to maintain the tungsten silicide layer integrity;
10. Form a second oxide layer overlying the nitride layer to form sandwiched oxide on nitride on oxide structure for a capacitor dielectric at a temperature to maintain the tungsten silicide layer integrity;
11. Form an upper capacitor plate overlying the second oxide layer to form the capacitor structure; and
12. Perform other steps, as desired.

The above sequence of steps provides a method for fabricating a capacitor structure according to an embodiment of the present invention. As shown, such steps include processing a tungsten silicide film to improve a breakdown voltage characteristic, among others, of the capacitor structure. Further details of the present invention can be found throughout the present specification and more particularly according to the figures described below.

Figure 1:
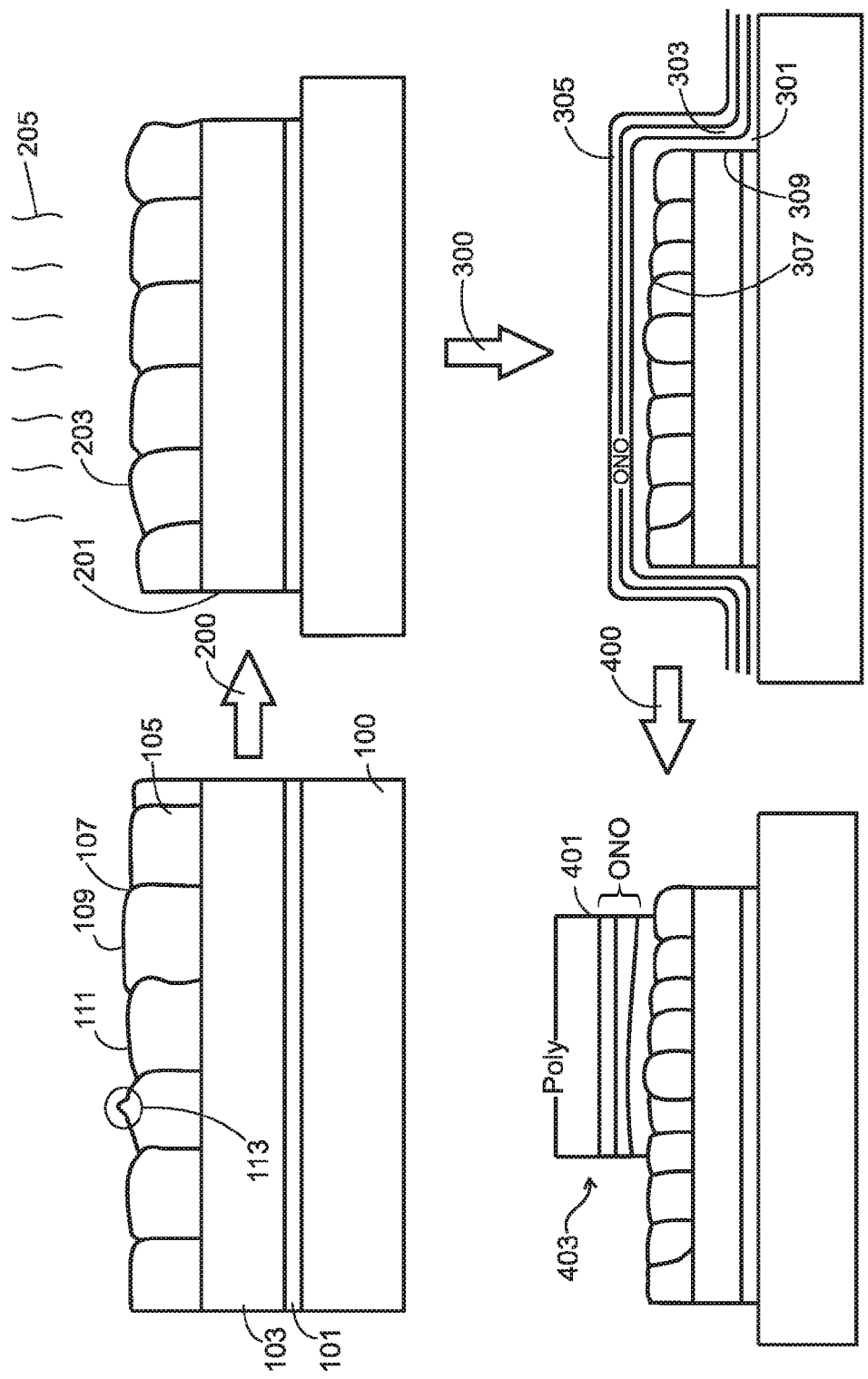
FIG. 1 illustrates a method of fabricating a capacitor structure for an integrated circuit device using simplified cross-sectional view diagrams according to an embodiment of the present invention.

FIG. 1 illustrates a method of fabricating a capacitor structure for an integrated circuit device using simplified cross-sectional view diagrams according to an embodiment of the present invention. These diagrams are merely an illustration, which should not unduly limit the scope of the claims herein. One of ordinary skill in the art would recognize many other variations, modifications, and alternatives. As shown, the method begins by providing a semiconductor substrate 100, e.g., silicon substrate, silicon on insulator, epitaxial silicon wafer and others. The substrate has an upper surface, which has a layer of dielectric material 101 formed thereon. The dielectric material can be silicon dioxide, silicon nitride, silicon oxynitride, among others. Preferably, the dielectric material is high quality and free from defects such as pinholes, and others. The method includes forming a first polysilicon layer 103 overlying the dielectric layer. The first polysilicon layer is often deposited using a chemical vapor deposition process. The polysilicon layer is also doped with an impurity to decrease resistivity. Doping may occur using implantation, diffusion, and in-situ doping techniques. The first polysilicon layer often has a phosphorus (P) dopant, which ranges from about $10^{21}$ atom/cm$^3$ to about $10^{22}$ atom/cm$^3$ in a specific embodiment. Of course there can be other variations, modifications, and alternatives.

The method deposits a tungsten silicide layer 105 (or like silicide layer) overlying the first polysilicon layer. As shown, the tungsten silicide has crystalline structure 111 and 109, among others. Each of the crystals may also have protrusions 113, which lead to surface roughness. The method anneals the tungsten silicide layer to cause further crystallization of the tungsten silicide layer. Annealing often occurs using a rapid thermal anneal process that ranges in temperature from about 700 to about 950° C. in a specific embodiment. The anneal process is also performed for about 10 seconds to about 200 seconds in preferred embodiments. The rapid thermal anneal can also be replaced by other anneal processes such as furnace anneal and the like. The further crystallization of the tungsten silicide layer reduces surface roughness and also reduces the granular structure of the tungsten silicide film in a specific embodiment. Of course there can be other variations, modifications, and alternatives.

Referring to the reference arrow 200, the method patterns the combined tungsten silicide layer and the polysilicon layer to define a bottom electrode of a capacitor structure. Conventional masking and etching techniques are used for patterning these layers. As shown, a patterned edge 201 is illustrated. The patterned bottom electrode is subjected to a heat treatment 205 to further stabilize one or more grains on at least one or more edges of the patterned tungsten silicide layer in a specific embodiment. In a specific embodiment, the heat treatment can be an anneal process. The anneal process is preferably a rapid thermal anneal in a specific embodiment. Annealing can occur at a temperature ranging from about 700 to about 950° C. for a time period ranging from about 10 seconds to about 200 seconds in a preferred embodiment. This heat treatment enables the probable grain growth, which may happen at later stages, to happen at this stage so that dielectric layers to be deposited on a top region of the bottom electrode will have a stable poly-grain silicide (for example, WSi) layer as the bottom electrode. As shown, each of the grains/crystals 203 have been stabilized. In certain embodiments, one or more gates for MOS devices are formed concurrently with the bottom electrodes. Of course there can be other variations, modifications, and alternatives.

Referring to reference arrow 300, the method then forms a combination of layers for the capacitor dielectric. Here, the method forms a first oxide layer 301 at a thickness ranging from about 5 nanometers to about 40 nanometers overlying tungsten silicide layer 307. The first oxide layer can be formed using an oxide deposition process in a specific embodiment. The deposition process uses an oxygen bearing gas and a silicon bearing gas at a temperature ranging from about 600° C. to about 850° C. in a specific embodiment. The method also forms a nitride layer 303 at a thickness ranging from about 5 nanometers to about 40 nanometers overlying the first oxide layer. A second oxide layer 305 is deposited to a thickness ranging from about 5 nanometers to about 40 nanometers at a temperature ranging from about 600° C. to about 850° C. overlying the nitride layer. The combination of the first oxide layer, the nitride layer, and the second oxide layer form a sandwiched oxide on nitride on oxide structure of the capacitor dielectric. Preferably, the second oxide layer is formed using a deposition process, which uses an oxygen bearing gas and a silicon bearing gas at a temperature of about 600° C. to about 850° C. The oxide-on-nitride-on-oxide structure also covers edges of the polysilicon layer and the silicide layer. Preferably, the processing temperature range of these dielectric layers keeps the patterned tungsten silicide layer substantially free from oxidation.

Now referring to reference numeral 400. The method forms an upper capacitor layer overlying the sandwiched dielectric structure. Here, the upper capacitor layer is made using a second polysilicon layer, which is deposited using a chemical vapor deposition process. The second polysilicon layer is often deposited using a chemical vapor deposition process. The second polysilicon layer may be further doped with an impurity to decrease resistivity. Doping may occur using implantation, diffusion, and in-situ doping techniques, and others. The second polysilicon layer often has a phosphorus (P) dopant, which ranges from about $10^{21}$ atom/cm$^3$ to about $10^{22}$ atom/cm$^3$. Other suitable dopants such as arsenic, antimony and the like may also be used. The upper capacitor layer is patterned to form the upper capacitor plate 401 of the capacitor structure 403. The capacitor structure is characterized by a breakdown voltage of greater than about 30 volts for a test area of about 7000 um$^2$. Further details of certain tests results can be found throughout the present specification and more particularly below.

Figure 2:
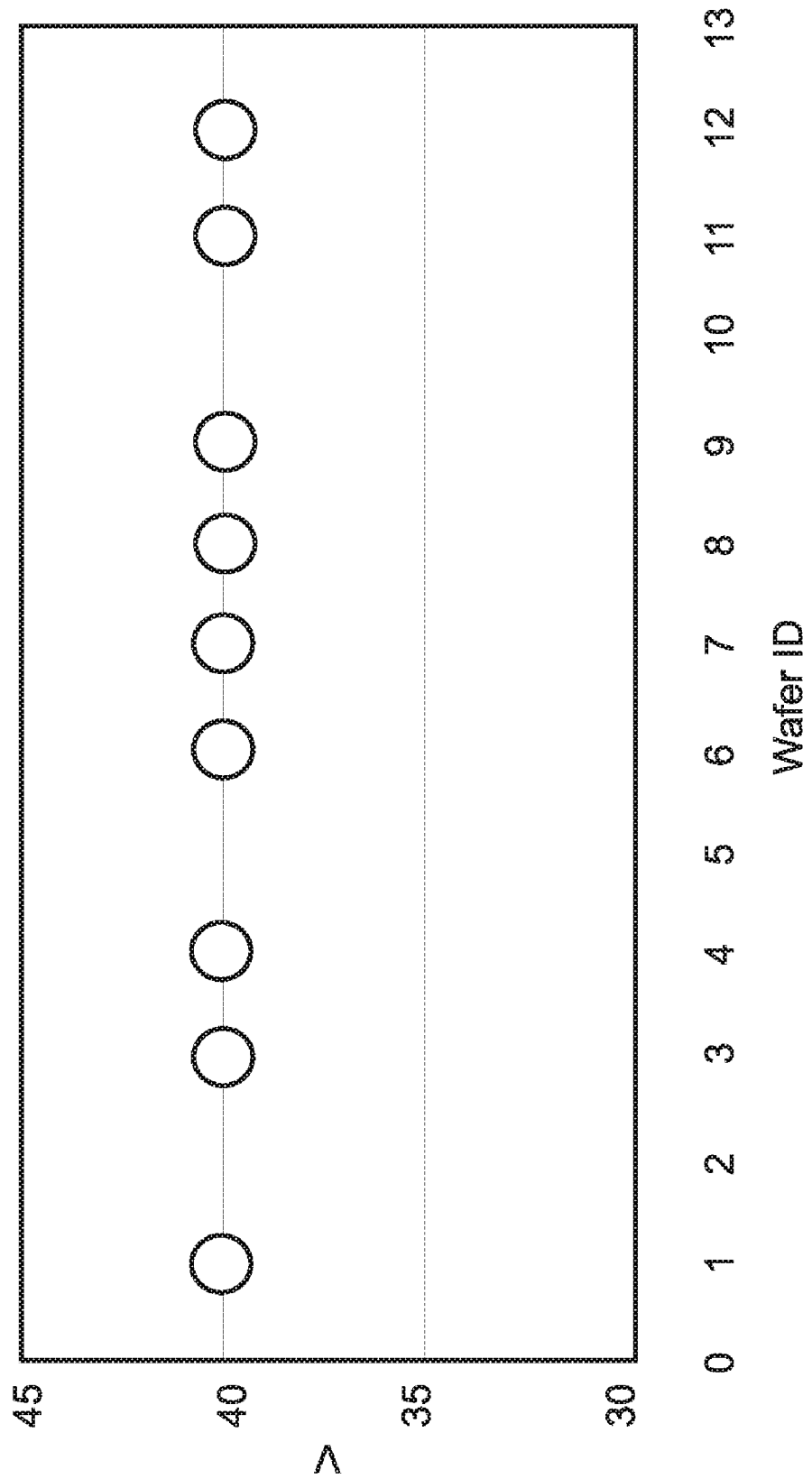
FIGS. 2 through 3 are simplified diagrams illustrating experimental results according to an embodiment of the present invention
Figure 3:
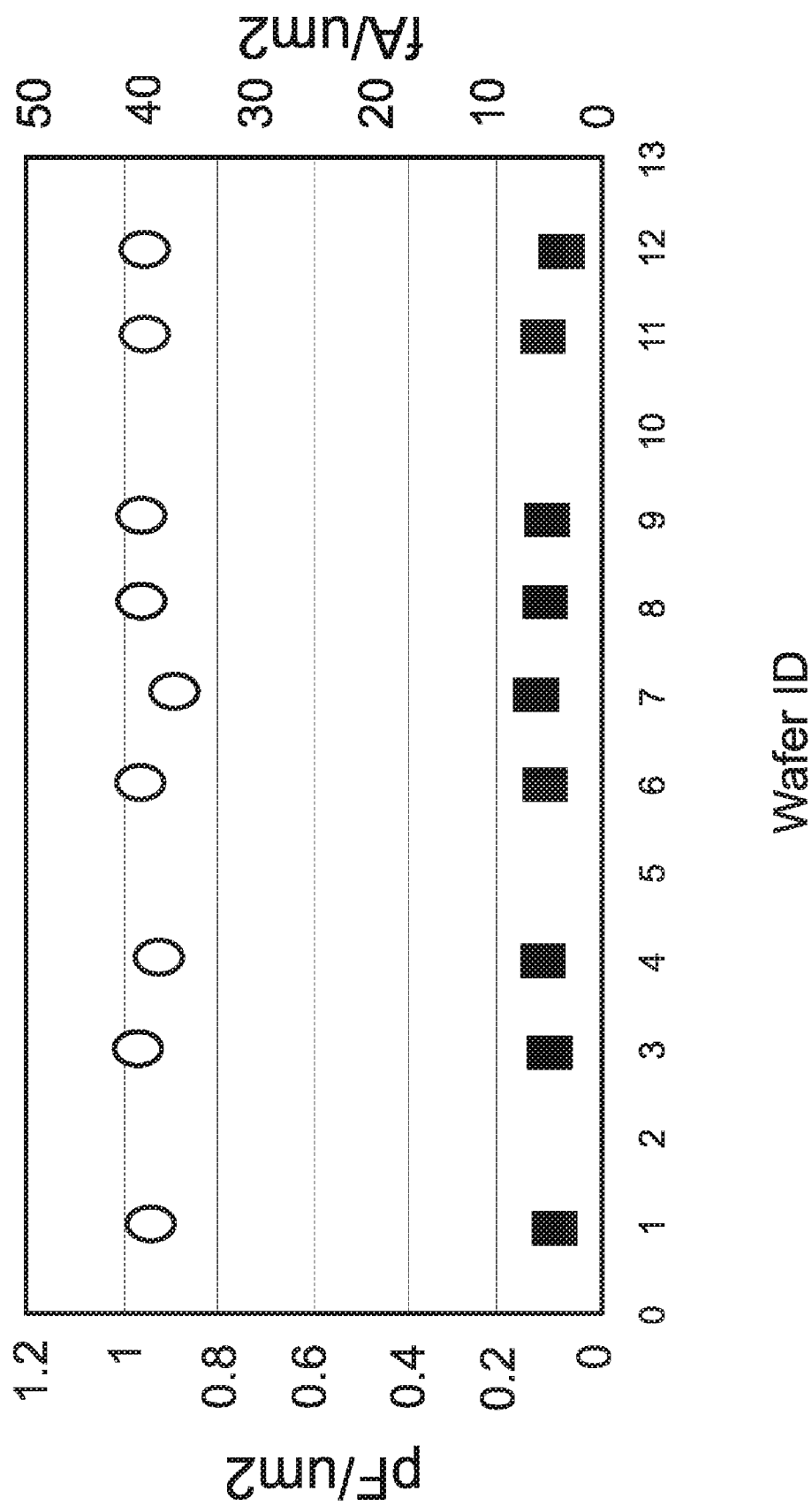

FIGS. 2 through 3 are simplified diagrams illustrating experimental results according to an embodiment of the present invention. These experimental results were obtained using capacitor structures according to the present invention. These capacitor structures were build using the methods described above. As shown, improved results were achieved by way of the present capacitor structures. FIG. 2 illustrates breakdown voltage on the vertical axis plotted against wafer number on the horizontal axis for a number of test wafers. As shown, the breakdown voltage is greater than 30 volts and appears to center around 40 volts for a certain sample size. The sample size is a 7000 um$^2$ capacitor size in a specific embodiment. FIG. 3 illustrates capacitance per unit area and leakage current plotted against wafer number on the horizontal axis. As shown, the circular representations illustrate capacitance of about 10 fA/um$^2$ at 7000 um$^2$ and the dark square representations illustrate leakage current of less than 10 fA/um$^2$ at 10 volts for a 7000 um$^2$ capacitor. These diagrams are merely examples and should not unduly limit the scope of the claims herein. One of ordinary skill in the art would recognize many variations, modifications, and alternatives.

Although the above has been illustrated according to a specific embodiment, there can be other modifications, alternatives, and variations. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit device having a capacitor structure, comprising:
   a substrate;
   a dielectric layer overlying the substrate;
   a first polysilicon layer overlying the dielectric layer;
   a tungsten silicide layer overlying the first polysilicon layer;
   a first oxide layer overlying the tungsten silicide layer;
   a nitride layer overlying the oxide layer;
   a second oxide layer overlying the nitride layer to form a sandwiched oxide on nitride on oxide structure, the sandwiched oxide on nitride on oxide structure forming a capacitor dielectric material; and
   an upper capacitor plate formed overlying the second oxide layer.

2. The device of claim 1 wherein the tungsten silicide layer having a granular characteristic.

3. The device of claim 1 wherein the first oxide is provided using a high temperature oxide process.

4. The device of claim 3 wherein the high temperature oxide process comprises depositing an oxygen bearing species at a temperature ranging from about 600° C. to about 850° C.

5. The device of claim 1 wherein the second oxide is provided using a high temperature oxide process.

6. The device of claim 5 wherein the high temperature oxide process comprises depositing an oxygen bearing species at a temperature ranging from about 600° C. to about 850° C.

7. The device of claim 1 wherein the capacitor structure is a high voltage capacitor being capable of operating at a voltage greater than about 30 volts.

8. The device of claim 1 wherein the tungsten silicide layer and the first polysilicon layer provide for one or more gate structures for the integrated device.

9. The device of claim 1 wherein the capacitor structure is provided for an LCD drive or a controller.

10. The device of claim 1 wherein the silicon nitride is deposited at a temperature ranging from about 600° C. to about 850° C.

* * * * *